United States Patent [19]

Martinson et al.

[11] Patent Number: 5,446,923
[45] Date of Patent: Aug. 29, 1995

[54] MIXER USING FUNDAMENTAL FREQUENCY OR SECOND OR THIRD HARMONIC FREQUENCIES OF A LOCAL OSCILLATOR FOR MAXIMIZED RESULTANT FREQUENCY MIXER PRODUCT

[75] Inventors: Glen D. Martinson, Oakville, Canada; Marian M. Burin, Conyers, Ga.

[73] Assignee: B.E.L.-Tronics Limited, Mississauga, Canada

[21] Appl. No.: 205,169

[22] Filed: Mar. 3, 1994

[51] Int. Cl.6 .......................... H04B 1/28; G01S 7/36; G01S 7/285
[52] U.S. Cl. ....................................... 455/330; 342/20; 455/317
[58] Field of Search .................. 342/20, 175, 193; 455/318–319, 313–315, 228–229, 323, 325, 330, 226.1, 317

[56] References Cited

U.S. PATENT DOCUMENTS

| | | | |
|---|---|---|---|
| 4,313,216 | 1/1982 | Jaeger et al. | 342/20 |
| 4,630,054 | 12/1986 | Martinson | 342/20 |
| 4,952,936 | 8/1990 | Martinson | 342/20 |
| 4,961,074 | 10/1990 | Martinson | 342/20 |
| 5,146,227 | 9/1992 | Papadopoulos | 342/20 |
| 5,268,689 | 12/1993 | Ono et al. | 342/20 |

OTHER PUBLICATIONS

Sedra et al., "Microelectronic Circuits", 1982, pp. 130–132.

Primary Examiner—Edward F. Urban
Assistant Examiner—Mark D. Wisler
Attorney, Agent, or Firm—Donald E. Hewson

[57] ABSTRACT

A mixer is provided having a mixing element, an input signal port for incoming signals at a frequency $f_{IN}$, a local oscillator signal port for signals from a local oscillator having a fundamental frequency $f_{LO}$, and an output port from which the resultant frequency may be taken. Means are provided to impose a DC component of bias voltage across the mixing element at one of three levels. The mixer is such that it has a pair of conduction threshold voltages which are substantially symmetrical above and below zero volts, beyond which the mixing element will be conductive at least when a signal from the local oscillator is imposed on it. The signal from the local oscillator has substantially sinusoidal voltage waveform, with a peak-to-peak voltage which is greater than the voltage difference between the pair of conduction threshold voltages. When the first zero DC component bias voltage is imposed across the mixer element, the mixing element is conductive in respective symmetrical positive-going and negative-going senses, and the maximized resultant frequency is $|f_{IN} \pm 2f_{LO}|$. When the second DC component of bias voltage is imposed across the mixing element, it conducts only once per cycle of local oscillator voltage, so that the maximized resultant frequency is $|f_{IN} \pm f_{LO}|$. When the third DC component of bias voltage is imposed across the mixing element, the value of voltage across the mixing element exceeds the threshold voltage in the same sense as the voltage shift for about 35% to about 55% of the period of the local oscillator voltage cycle making the mixer conductive, but it is also conductive in the opposite sense for at least a portion of the remaining period of the cycle, so that third harmonic mixing occurs, and the maximized resultant frequency is $|f_{IN} \pm 3f_{LO}|$.

12 Claims, 3 Drawing Sheets

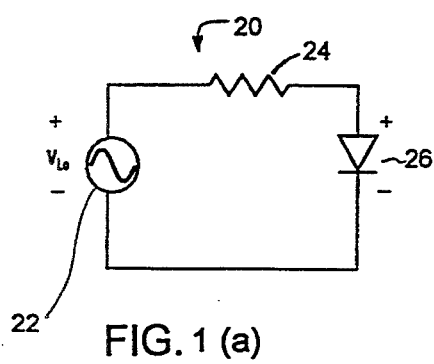
FIG. 1 (a)
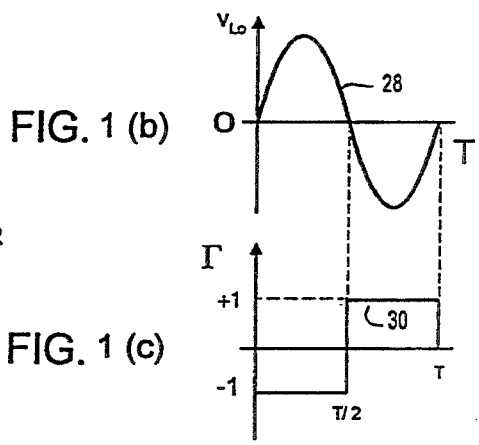
FIG. 1 (b)
PRIOR ART
FIG. 1 (c)
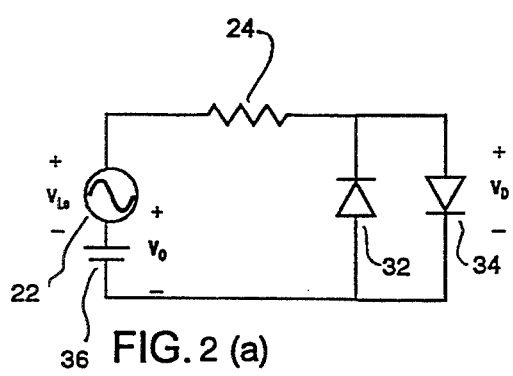
FIG. 2 (a)
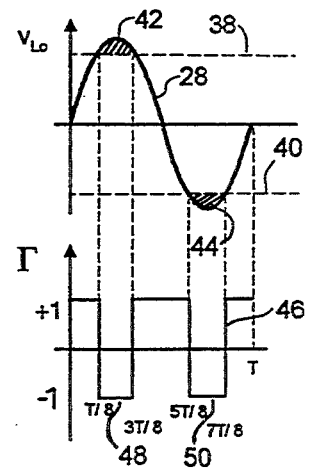
FIG. 2 (b)
PRIOR ART
FIG. 2 (c)

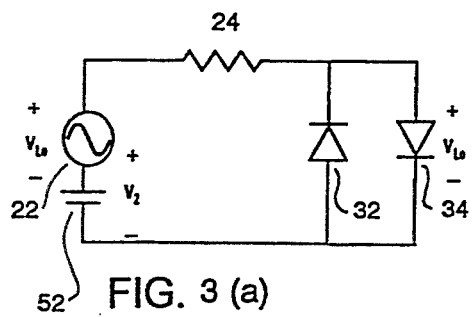
FIG. 3 (a)
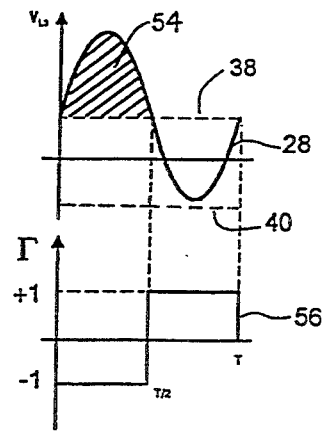
FIG. 3 (b)
PRIOR ART
FIG. 3 (c)
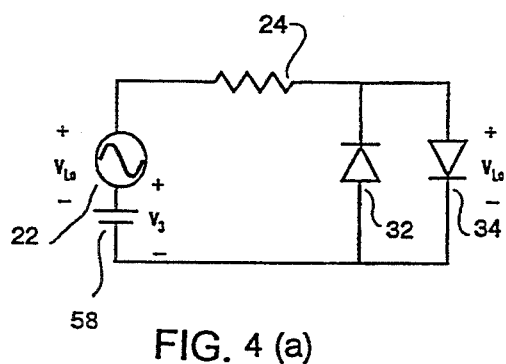
FIG. 4 (a)
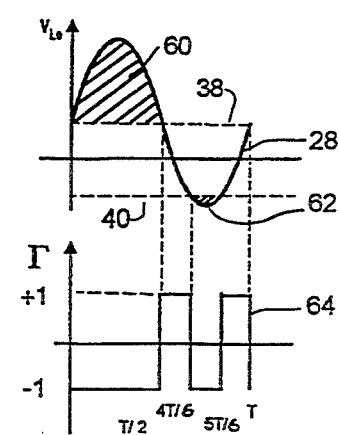
FIG. 4 (b)
FIG. 4 (c)

MIXER USING FUNDAMENTAL FREQUENCY OR SECOND OR THIRD HARMONIC FREQUENCIES OF A LOCAL OSCILLATOR FOR MAXIMIZED RESULTANT FREQUENCY MIXER PRODUCT

FIELD OF THE INVENTION

This invention relates to mixers for converting input signals, using a local oscillator, where the input signals may be at widely disparate frequencies. More particularly, the present invention is directed to mixers intended to give a substantially constant resultant frequency of mixer output product when any one of several input signals is being detected, where the input signals may be found over a range of several octaves, but where it is desired to use only a single local oscillator and to achieve maximized resultant frequency signals whose product may be an absolute value of mixed frequency product resulting from mixing the input signal plus or minus the fundamental local oscillator frequency, or the second or third harmonic of the fundamental local oscillator frequency.

BACKGROUND OF THE INVENTION

The present invention is particularly found to be useful when employed in police radar detectors. Generally, police radar devices are used in the detection and measuring the speed of moving vehicles, and an industry has developed whereby radar detectors are provided to the public, to be employed in vehicles of all sorts to determine the presence of a police radar in the vicinity of the vehicle. Also, many jurisdictions are beginning to utilize so-called "photo radar" devices, whereby a radar device constantly scans oncoming traffic for the presence of vehicles exceeding a posted speed limit, and thereafter a camera is operated to take a photograph of the vehicle as it leaves the immediate vicinity of the device so as to capture an image of the license plate of the vehicle on film. The radar detector industry has developed, not so much as to develop circumstances where a driver of a vehicle might drive his vehicle at an unnecessarily high speed simply because he feels he can do so with impunity due to the lack of police radar in the immediate area, but rather so as to forewarn drivers of the presence of police radar particularly in jurisdictions that use police radar and speeding tickets solely for the purposes of enriching the public coffers in that jurisdiction.

In North America, there are three bands of radar frequencies in which police radar devices presently operate: they are the X-Band, at 10.525 GHz; the K-Band, at 24.150 GHz; and the $K_a$-Band, which is centred about 34.7 GHz.

There are, of course, several approaches to designing and developing radar detectors that might detect the presence of police radar at those somewhat disparate frequencies. It will be noted that the difference between X-Band and K-Band is more than one octave, and between X-Band and $K_a$-Band is nearly two octaves, and yet police radar detectors are expected to operate efficiently and with increased sensitivity in all three bands. At the same time, the public expects to purchase such radar detectors at low prices, thereby forcing the manufacturers to improve their designs so as to meet the public demand for low cost, high sensitivity radar detectors that are capable of operating in three bands.

Some of the most successful commercial products that have been brought to the market, in the past, are those manufactured by the Assignee herein and which embody inventions particularly as defined and described in MARTINSON U.S. Pat. No. 4,961,074, issued Oct. 2, 1990, and U.S. Pat. No. 4,952,936 issued Aug. 28, 1990. Those two patents describe, respectively, multi-band radar detectors having a mixer in which direct current bias may be utilized so that the radar detector will monitor two different radar frequencies by application and non-application of the DC bias to the mixer, using a single local oscillator; and radar detectors that utilize a plurality of local oscillators so as to provide differing local oscillator frequencies to the mixer in order to achieve an appropriate resultant frequency or intermediate frequency. The common threads throughout those two patents are, however, that they rely upon the use of dielectric resonator local oscillators, and the requirement to use more than one local oscillator if more than two different radar frequencies are to be detected. The use of dielectric resonator first local oscillators permitted very effective coupling and decoupling of one or another of the multiple dielectric resonator local oscillators to a common microstrip feedline, so as to provide discrete local oscillator signals to the local oscillator input port of the mixer.

However, the use of multiple dielectric resonator local oscillators is costly; and it also precludes any possibility of sweeping a local oscillator through a band of frequencies since dielectric resonator local oscillators can operate only at a single, fixed frequency.

An earlier patent, also issued to Martinson, was U.S. Pat. No. 4,630,054 issued Dec. 16, 1986, and also commonly owned with the present application and the previously referred to patents. That patent disclosed a radar detection and signal processing circuit that could function at both X-Band and K-Band, where the incoming radar signal was mixed with a local oscillator output that had a specific frequency such that the resultant mixer product intermediate frequency from either X-Band or K-Band was a consequence of the fundamental or a second harmonic of the local oscillator frequency. The intermediate frequency may then be mixed with a signal from a swept frequency oscillator and then directed to a bandpass filter and other signal processing circuitry, to actuate an alarm. Because the local oscillator frequency was chosen so that its resultant frequency when mixed with X-Band or K-Band signals was a particular intermediate frequency signal, then signals from other than the X-Band or K-Band would not mix with the local oscillator output to produce the same intermediate frequency signal, and thus any other signals other than those at the required at the intermediate frequency could be effectively ignored.

The same principles effectively apply in the present application; that is, it is the purpose of the present invention to provide a mixer for a radar detector or otherwise, as discussed hereafter, where incoming signals from a variety of disparate frequency bands may be mixed with a local oscillator signal in such a manner that the resultant frequency—the intermediate frequency—is the absolute value of the incoming signal frequency plus or minus the fundamental frequency of the local oscillator, or twice that frequency (the second harmonic), or three times that frequency (the third harmonic).

Some further explanation of the operation of a mixer having a single oscillator follows:

First, a mixer element can be considered to be a two-terminal device; a single diode is a common example. The output from a local oscillator is generally a sinusoidal voltage at a fundamental frequency, at which oscillator energy is delivered to the mixer. However, the mixer—for purposes of this explanation, a single diode—conducts only when the voltage of the oscillator signal is above the threshold voltage of the diode, and only when the oscillator signal is in the correct positive-going or negative-going sense, depending on the orientation of the diode. The reflection coefficient of the diode ideally has the form of a square wave, it is either $+1$ or $-1$, with an abrupt transition from either state to the other. Therefore, for each cycle of an oscillator having a sinusoidal waveform, a single diode will conduct only once, and only during that half of the sinusoidal waveform that is in the correct sense and only when the voltage of the waveform exceeds the threshold voltage of the diode.

With no bias applied to a single diode mixing element, the effect of the diode threshold voltage is to cause the time duration of diode conduction to be less than the time duration of diode non-conduction in any given period. This causes the introduction of even harmonics in the diode reflection coefficient, and can be utilized to enhance mixer products arising from even harmonics of the diode reflection coefficient—in particular, the second harmonic in radar detector applications. This improved mixing at even harmonics comes at the expense of mixing products resulting from the fundamental and odd harmonics of the diode reflection coefficient. However, application of a suitable bias to the diode can equalize the conduction and non-conduction time intervals so as to enhance fundamental and odd harmonic mixing, while at the same time degrading even harmonic mix products.

MARTINSON U.S. Pat. No. 4,961,074 discusses an alternative arrangement where a pair of antiparallel diodes is used. In that case, the conduction waveform of the mixer diodes when the mixer is not biased has two conduction cycles for each one cycle of the oscillator signal. In other words, the conduction waveform has a frequency which is twice the fundamental frequency of the local oscillator. However, when a bias is applied, then the local oscillator output is shifted so that only one or the other of the diodes will be conductive, and the conduction waveform of the mixer has a fundamental frequency which is equal to the fundamental frequency of the local oscillator. These factors are discussed in greater detail hereafter.

The inventors herein have discovered that, quite unexpectedly, if differing values of bias—a first zero DC component, or a second level or third level DC component, where the second level is higher than the third level—are imposed across a mixing element, and the mixing element is a two-terminal device that has substantially symmetrical non-linear forward and reverse voltage/current characteristics, then conversion loss in the mixing element may be minimized so as to maximize the magnitude of the resultant frequency mixer product signal at frequencies that are the absolute values of the mixing product of an incoming signal plus or minus the frequency of the local oscillator, or its second or third harmonics.

Assuming a first input signal at a frequency of $f_{IN}$, and a mixing element reflection coefficient that is essentially a square wave in nature as a result of the non-linear mixing elements being driven by a sinusoidal local oscillator, then the signal at frequency $f_{IN}$ is multiplied by the square wave reflection coefficient waveform, which may have frequency components $f_{LO}$, $2f_{LO}$, $3f_{LO}$, $4f_{LO}$, etc., depending on the relative time duration of positive and negative portions of any one cycle. This multiplication will give rise to product terms that include frequencies $|f_{IN} \pm f_{LO}|$, $|f_{IN} \pm 2f_{LO}|$, $|f_{IN} \pm 3f_{LO}|$, etc., where the magnitude of each term is proportional to the magnitude of the respective term $f_{LO}$, $2f_{LO}$, $3f_{LO}$, etc., in the reflection coefficient waveform.

Thus, the present invention provides a mixer for converting input signals from a first signal source at a frequency of $f_{IN}$, where the mixer comprises a mixing element, a local oscillator having a fundamental frequency $f_{LO}$, means for conducting the input signals to an input signal port of the mixing element, means for conducting signals from the local oscillator to a local oscillator signal input port of the mixing element, and means for conducting a maximized resultant frequency signal away from an output port of the mixing element.

In a particular aspect of the present invention, the mixer further comprises a DC bias source for imposing a DC component of bias voltage across the mixing element. The magnitude of the resultant frequency signal may thus be maximized by a selection of a DC bias so as to minimize conversion loss in the mixing element at any one of the following group of frequencies: $|f_{IN} \pm f_{LO}|$, $|f_{IN} \pm 2f_{LO}|$ and $|f_{IN} \pm 3f_{LO}|$.

The mixing element is a two-terminal device, and it is a condition of the present invention that the mixing element has a substantially symmetrical non-linear forward and reverse voltage/current characteristic.

The DC bias source further comprises means to adjust the level of the DC component of bias voltage which is imposed across the mixing element to any one of three levels, being a first zero DC component, or a second DC component, or a third DC component. The second DC component of bias voltage that is imposed across the mixing element is higher than the third DC component of bias voltage across the mixing element.

Moreover, the mixing element must have a pair of conduction threshold voltages which are substantially symmetrical above and below zero volts, beyond which the mixing element will be conductive at least when a signal from the local oscillator is imposed on the mixing element. The signal from the local oscillator has a substantially sinusoidal voltage waveform, and its peak-to-peak voltage is greater than the voltage difference between the pair of conduction threshold voltages of the mixing element.

In the presence of the substantially sinusoidal waveform signal from the local oscillator, when the first zero component of bias voltage is imposed across the mixing element, the voltage across the mixing element is centred about zero volts and it passes through each of the conduction threshold voltages in a respective symmetrical positive-going and negative-going sense. When the second DC component of bias voltage is imposed across the mixing element, the voltage across the mixing element is shifted by the amount of the second DC component of bias voltage with respect to zero volts in the same sense as the bias voltage is directed, so that the voltage across the mixing element is above or below zero volts for a first substantial portion of each cycle of local oscillator signal, and below or above zero volts for only a second small portion of each cycle. The magnitude of the value of the voltage across the mixing element during that first portion exceeds the threshold voltage in the same sense as the voltage shift for about 40% to about 60% of the period of that cycle, so that the mixing element is conductive in its respective direction during that 40% to about 60% of the period of the cycle. Conversely, the magnitude of the value of voltage across the mixing element during the second small portion of the cycle is less than the threshold voltage in the opposite sense as the voltage shift is applied, so that the mixing element is not conductive at any time during that second smaller portion.

However, when the third DC component of bias voltage is imposed across the mixing element, the voltage across the mixing element is shifted by the amount of the third DC component of bias voltage with respect to zero volts in the same sense as the bias voltage is directed, so as to be above or below zero volts for a first portion of each cycle, and below or above zero volts for a second portion of each cycle of local oscillator voltage. The magnitude of the value of voltage across the mixing element during the first portion exceeds the threshold voltage in the same sense as the voltage shift for about 35% to about 55% of the period of that cycle, so that the mixing element is conductive in its respective direction during that 35% to about 55% of the cycle. Moreover, the magnitude of the value of the voltage across the mixing element during the second portion of the cycle also exceeds the threshold voltage in the opposite sense as the voltage shift is directed, so that the mixing element is conductive in the opposite direction of the DC bias voltage shift for a third period of time during that second portion of the cycle.

Thus, the mixing element has an idealized reflection coefficient waveform that has a fundamental frequency which is twice the fundamental frequency of the local oscillator when the first zero DC component of bias voltage is imposed across the mixing element, so as to give the maximized resultant frequency $|f_{IN} \pm 2f_{LO}|$. Also, the idealized reflection coefficient waveform has a fundamental frequency which is equal to the fundamental frequency of the local oscillator when the second DC component of bias voltage is imposed across the mixing element, so as to give the maximized resultant frequency $|f_{IN} \pm f_{LO}|$. Finally, the idealized reflection coefficient waveform has a large amplitude component that is at a frequency which is three times the fundamental frequency of the local oscillator, when the third DC component of bias voltage is imposed across the mixing element, so as to give the maximized resultant frequency $|f_{IN} \pm 3f_{LO}|$.

The mixer element may be a planar doped barrier diode, which will exhibit substantially symmetrical non-linear forward and reverse voltage/current characteristics. Also, if the mixer is to be utilized at lower frequencies than radar frequencies per se, such as for other purposes of mixing radio frequency signals, the mixing element may be a pair of zener diodes that are connected in antiseries—that is, back-to-back.

Particularly when the mixer of the present invention is being used in radar detectors, the mixing element may be a pair of antiparallel diodes. One particularly useful embodiment is, therefore, utilization of mixer in keeping with the present invention, together with a single local oscillator, in a radar detector that is adapted to detect radar frequencies in X-Band, K-Band, and $K_a$-Band.

BRIEF DESCRIPTION OF THE DRAWINGS

Embodiments of this invention will now be described by way of example in association with the accompanying drawings in which:

FIG. 1(a) describes an idealized single diode mixer in keeping with the prior art, FIG. 1 (b) shows an oscillator output waveform, and FIG. 1(c) describes the diode reflection coefficient waveform;

FIG. 2(a) describes an idealized mixer having antiparallel diodes and a first zero bias voltage, with reference to the prior art, FIG. 2(b) describes the local oscillator waveform relevant to the conduction threshold voltages of the antiparallel diodes, and FIG. 2(c) describes the resultant idealized reflection coefficient waveform;

FIG. 3(a) describes an idealized mixer having antiparallel diodes and a second DC bias level which is applied in keeping with the prior art so that the mixing element is not conductive at any time during a second portion of the local oscillator cycle, FIG. 3(b) describes the local oscillator waveform relevant to the conduction threshold voltages of the antiparallel diodes, and FIG. 3(c) describes the resultant idealized reflection coefficient waveform;

FIG. 4(a) describes an idealized mixer having antiparallel diodes and a third DC bias level, FIG. 4(b) describes the local oscillator waveform relevant to the conduction threshold voltages of the antiparallel diodes, and FIG. 4(c) shows the reflection coefficient waveform which is such that the mixer element is conductive during at least a portion of each half cycle of local oscillator voltage;

DETAILED DESCRIPTION OF THE PREFERRED EMBODIMENTS

Figure 5:
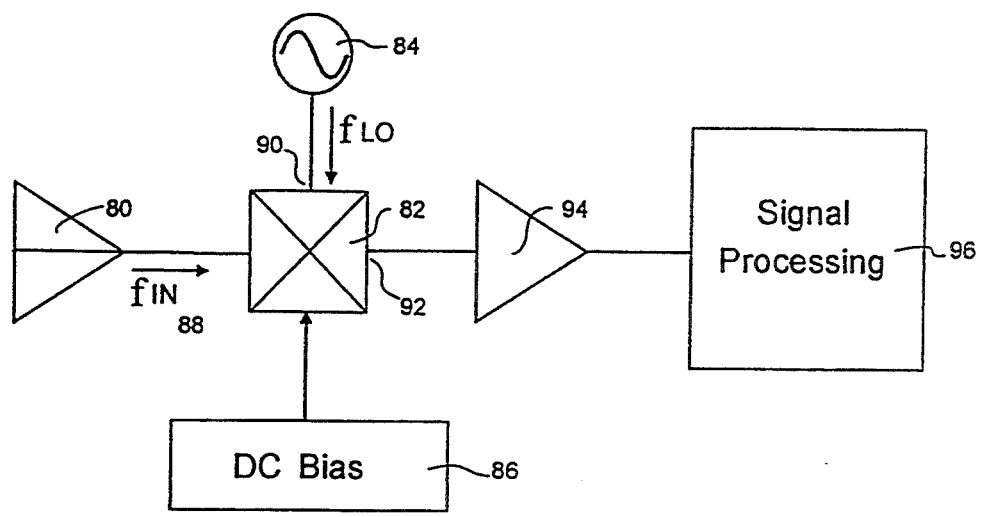
FIG. 5 is a basic schematic showing the use of a mixer in keeping with the present invention.

Reference will now be made to FIGS. 1 to 7.

The theory behind the present invention comes from an unexpected realization that third harmonic mixing can be accomplished, provided that the mixing element is a two-terminal device having a substantially symmetrical non-linear forward and reverse voltage/current characteristic, and that it has a pair of conduction threshold voltages which are substantially symmetrical above and below zero volts, beyond which the mixing element will be conductive at least when a signal from a local oscillator is imposed on the mixing element. This, together with an examination of Fourier series expressions for the reflection coefficient waveform which occurs when the mixer goes into conduction or into cutoff, led to the realization that a DC bias component across a mixing element could be established at one of a number of different levels—rather than the prior consideration that it should be set at either zero volts or sufficiently high that the mixing element would be conductive for only about one-half of a cycle of applied local oscillator sinusoidal voltage.

The following discussion assumes ideal conduction characteristics for a diode; that is, either the diode is in conduction or it is in cutoff, with an abrupt change between those states. Indeed, relatively close to those idealized conditions can be realized in practice, especially using currently available state-of-the-art devices such as planar doped diodes or gallium arsenide (GaAs) diodes.

In any event, first having regard to FIG. 1, an idealized single diode mixer 20 is described. It comprises a source 22 of local oscillator voltage $v_{LO}$ which has a sinusoidal waveform, a source impedance 24, and a single diode 26 across which a voltage $v_D$ is developed. As shown in FIG. 1(b), the waveform 28 of the local oscillator is a sinusoidal waveform which is centred about zero volts.

FIG. 1(c) shows the reflection coefficient waveform, where the reflection coefficient ($\Gamma$) is plotted. During conduction, the diode is assumed to be a short circuit, and thus it gives a reflection coefficient ($\Gamma$) of minus one (−1). During cutoff, the idealized diode 26 is assumed to be an open circuit, thereby giving a reflection coefficient of plus one (+1). This is shown in curve 30, where the diode 26 is shown in conduction for the first half of the period of the waveform 28. The further assumption is made, for purposes of this discussion, that either there is negligible diode threshold voltage for the diode 26, or that the value of the applied local oscillator voltage is high compared with the threshold voltage of the diode 26. Thus, waveform 30 may be considered to be essentially a perfect square wave, for purposes of the present discussion, and the time varying reflection coefficient of the diode 26 can be expanded in a Fourier series, as follows:

$$\Gamma(t) = \frac{-4}{\pi}\left( \operatorname{Sin}\omega_{LO}t + \frac{1}{3}\operatorname{Sin}3\omega_{LO}t + \frac{1}{5}\operatorname{Sin}5\omega_{LO}t + \ldots \right)$$

The value of $\omega_{LO}$ is, of course, a function of the period of the waveform 28 or a function of the frequency of the waveform, as given by the expression:

$$\omega_{LO} = 2\frac{\pi}{T} = 2\pi f$$

If the idealized diode 26 is embedded in a transmission structure, and there is an incident signal having a voltage $V_I$ whose value is $V_S \operatorname{Sin}\omega_S t$, then the value of the reflected voltage $V_R$ may be given by the following expressions, which equate the reflected voltage to the reflection coefficient $\Gamma(t)$ and the incident signal voltage $V_I$, as follows:

$$V_R = \Gamma(t) \times V_I$$

$$V_R(t) = \Gamma(t) V_S \operatorname{Sin} \omega_S t$$

This gives rise to the following Fourier series expression for the reflected voltage $V_R$ being:

$$(V_S \operatorname{Sin}\omega_S t)\left(-\frac{4}{\pi}\right)\left( \operatorname{Sin}\omega_{LO}t + \frac{1}{3}\operatorname{Sin}3\omega_{LO}t + \frac{1}{5}\operatorname{Sin}5\omega_{LO} + \ldots \right)$$

With appropriate trigonometric substitutions, the above expression results in a value of $V_R$ as follows:

$$-4\frac{V_S}{\pi}\left[\left(\frac{1}{2}\right)\operatorname{Cos}(\omega_{LO}-\omega_S)t - \frac{1}{2}\operatorname{Cos}(\omega_{LO}+\omega_S)t + \frac{1}{6}\operatorname{Cos}(3\omega_{LO}-\omega_S)t - \frac{1}{6}\operatorname{Cos}(3\omega_{LO}+\omega_S)t \ldots \right]$$

In general, mixers are used in down conversion applications, although they may be used in up conversion applications as well. In down conversion applications, the reflected voltage components which involve differences in frequency are then used as the desired intermediate frequency signals. The magnitude of that resultant frequency is an absolute value given by the general expression $|f_{IN} \pm x f_{LO}|$, where x may have a digital value of one, two, or three.

Obviously, having regard to the expressions above, the terms for the desired intermediate frequency signals may be generated from the fundamental and harmonic components of the reflection coefficient waveform—assuming essentially a square wave which is subject to Fourier series analysis. The conversion gain is expressed in dB, and is $10 \log_{10} P_{IF}/p_S$, where $P_{IF}$ is the power in the desired component of the reflected voltage, and $p_S$ is the power in the incident waveform.

By inspection, it is noted that each component of the reflected voltage wave is the result of the product of the incident signal and the respective component of the reflection coefficient waveform. In order to maximize a particular component of the reflected signal, therefore, the corresponding component of the reflection coefficient waveform must be maximized.

Conversion gain for a fundamental mix component is given by the following expression:

$$10\log_{10}\frac{\left(\frac{2V_S}{\pi}\right)^2}{V_S^2} = 10\log_{10}\frac{4}{\pi^2} = -3.92 \, dB$$

This conversion gain of −3.92 dB is more commonly stated as a conversion loss of 3.92 dB.

Likewise, conversion gain for the third harmonic mix component is:

$$10\log_{10}\frac{\left(\frac{4V_S}{6\pi}\right)^2}{V_S^2} = 10\log_{10}\frac{4}{9\pi^2} = -13.46 \, dB$$

This clearly gives a conversion loss of 13.46 dB.

Now, referring to FIG. 2, a mixer is shown which comprises an antiparallel pair of diodes 32, 34. The local oscillator voltage source 22, and the source impedance 24, remain the same; and for purposes of comparative discussion which follows, the circuit of FIG. 2(a) is also shown having a DC bias source 36 whose value is such that there will be zero DC component of bias voltage across the mixing element 32, 34.

Having regard to FIG. 2(b), the pair of conduction threshold voltages 38 and 40 are shown against the trace 28 of the local oscillator voltage, so that it is clear that one or the other of the diodes 32 and 34 is conductive during two portions of the cycle of the local oscillator voltage as shown at 42 and 44.

From this, the reflection coefficient waveform is shown as being a square wave 46, which is shown to have two intervals 48 and 50 where the mixer element is conductive. That means that the fundamental frequency component of the diode reflection coefficient waveform is twice the local oscillator frequency; or the frequency of waveform 46 is twice the frequency of waveform 28.

Now, referring to FIG. 3, the DC bias voltage $V_2$ shown at 52 is such that the second DC component of bias voltage imposed across the mixing element 32, 34 is arranged so that the mixing element is conductive during the portion 54 of its cycle, as shown in FIG. 3(b), and not at all conductive during the second half of the cycle of waveform 28 from the local oscillator. In other words, at no point does the voltage of waveform 28 in FIG. 3(b) go below the threshold voltage 40. This gives rise to a reflection coefficient waveform 56, which clearly has the same frequency as the local oscillator signal.

Accordingly, because the reflection coefficient waveform has the same frequency as the local oscillator, the solution for conversion loss is the same as for the fundamental mix component of the discussion above with respect to FIG. 1, namely 3.92 dB.

However, solution for the third harmonic mix component of reflection coefficient waveform 56 gives, as above, a conversion loss of 13.46 dB. Turning now to FIG. 4, the value of the DC voltage $V_3$, shown at 58, is set so that a third DC component of bias voltage is imposed across the mixing element 32, 34, in such a manner that the mixing element is conductive during those portions of the local oscillator waveform output shown at 60 and 62 in FIG. 4(b). Here, the diode reflection coefficient waveform of the antiparallel diode pair 32, 34 has been optimized for third harmonic mixing, giving a Fourier series for the reflection coefficient waveform as:

$$\Gamma(t) = -\frac{3.5}{\pi}\left[\operatorname{Sin}\omega_{LO}t - \frac{8}{3\pi}\operatorname{Sin}3\omega_{LO}t - \frac{4.5}{5\pi}\operatorname{Sin}5\omega_{LO}t + \ldots\right]$$

As noted above, the reflected voltage waveform, given the incident signal as stated above, is:

$$V_R(t) = \Gamma(t) V_S \operatorname{Sin} \omega_S t$$

From the above, the expression for the reflected voltage $V_r(t)$ is:

$$-\frac{3.5 V_S}{\pi}\left[\frac{\operatorname{Cos}(\omega_{LO} - \omega_S)t}{2} - \frac{\operatorname{Cos}(\omega_{LO} + \omega_S)t}{2}\right] - \frac{8 V_S}{3\pi}\left[\frac{\operatorname{Cos}(3\omega_{LO} - \omega_S)t}{2} - \frac{\operatorname{Cos}(3\omega_{LO} + \omega_S)t}{2}\right]$$

From all of the above, the third harmonic conversion loss of the circuit in FIG. 4 is:

$$10\log_{10}\frac{\left(\frac{4V_S}{3\pi}\right)^2}{V_S^2} = 10\log_{10}\frac{16}{9\pi^2} = 7.44 \, dB$$

Obviously, by comparing a 7.44 dB third harmonic conversion loss to a 13.46 dB conversion loss of a third harmonic mix component as noted above, a circuit having characteristics and relationship of the local oscillator voltage and a reflection coefficient waveform, as shown, gives results which are about 6 dB better. This, of course, increases the sensitivity of the device, such as a radar detector, in which such a circuit is incorporated.

To more completely describe the relationships of the second and third DC components of bias voltages, imposed across the mixing element 32, 34 and resulting in the conduction and cutoff characteristics and the reflection coefficient waveform as described above with respect to FIGS. 3 and 4, they are as follows:

First, when the second DC component of bias voltage is imposed across the mixing element, the voltage across the mixing element is shifted by the amount of the second DC component of bias voltage with respect to zero volts in the same sense as the bias voltage is directed (as shown in FIGS. 3 and 4, in the positive sense) so that the voltage across the mixing element is above zero volts (in these cases) for a substantial portion of each cycle, and below zero volts for only a small second portion of each cycle. This results in the magnitude of the value of voltage across the mixing element during the first portion exceeding the threshold voltage 38 for about 40% to about 60% of the period of the cycle, so that the mixing element is conductive in the same direction during that 40% to about 60% of the period of the cycle. Also, as noted, the mixing element is not conductive at any time during the second smaller portion of the cycle.

However, when the third DC component of bias voltage is imposed across the mixing element, the voltage across the mixing element is shifted by the amount of that third DC component with respect to zero volts (again, in this case, positively) so as to be above zero volts for a first portion of each cycle and below zero volts for a second portion of each cycle. In this case, the magnitude of the voltage across the mixing element during the first portion exceeds the threshold voltage 38 for about 35% to about 55% of the period of the cycle, as noted in FIG. 4(b). Also, the magnitude of the value of voltage across the mixing element during the second portion exceeds the threshold voltage 40 so that the mixing element is also conductive in the opposite direction for a third period of time during that second portion, as shown at 62.

All of the above therefore provides a condition where the mixing element will have an idealized reflection coefficient waveform having a fundamental frequency which is twice the fundamental frequency of the local oscillator when the first zero DC component of bias voltage is imposed across the mixing element. This gives the maximized resultant frequency $|f_{IN} \pm 2f_{LO}|$. Likewise, when the idealized reflection coefficient waveform has a fundamental frequency which is equal to the fundamental frequency of the local oscillator, when the second DC component of bias voltage is imposed across the mixing element, the maximized resultant frequency is given as $|f_{IN} \pm f_{LO}|$.

Finally, the idealized reflection coefficient waveform has a large amplitude component that is at a frequency that is three times the fundamental frequency of the local oscillator, giving a third harmonic conversion loss of 6 dB better than has been previously attainable, when the third DC component of bias voltage is imposed across the mixing element. The maximized resultant frequency is $|f_{IN} \pm 3f_{LO}|$.

FIG. 5 shows a typical manner in which a mixer of the present invention may be employed. In this case, a radar detector would have a broadband horn antenna 80, a mixing element 82, a local oscillator 84, and a controllable source of DC bias 86. Signal from the antenna 80 at frequency $f_{IN}$ is fed to an input signal port 88. Likewise, the signal from the local oscillator 84 at frequency $f_{LO}$ is fed to a local oscillator port 90 of the mixing element 82. The maximized resultant frequency signal—the maximization resulting from the choice of DC bias level, and therefore the level of DC component of bias voltage across the mixing element, as discussed above—is conducted away from an output port 92 of the mixing element 82. Usually, the signal is then fed such as to an amplifier 94 and thence to additional signal processing circuitry 96, as is well known, such as from other issued United States patents that are commonly owned herewith, as referenced above.

The nature of the local oscillator 84 may be such that is comprises a dielectric resonator so as to become a dielectric resonator local oscillator, or it may be a more conventional oscillator employing appropriate solid state devices, transistors, Gunn diodes, etc. In any event, with appropriate means taken for isolation between oscillators, it is possible that another or plural oscillators could be used. In that case, an appropriate switch would be provided so as to switch between one oscillator and another, thereby isolating the remaining oscillator or oscillators. Each oscillator would, in turn, feed its signal through a switch to the local oscillator port 90. An example of such configuration might be when down conversion is required to be made with incoming signals in a range of, say, 10 Ghz up to about 35 Ghz, such as in a radar detector; while at the same time, other incoming signals in the range of, say, 40 Ghz to about 65 Ghz may also be in frequency band of interest for down conversion purposes. In that case, two oscillators might be provided, one operating at, say, 11.5 Ghz±, and the other operating at 21.5 Ghz±.

Figure 7:
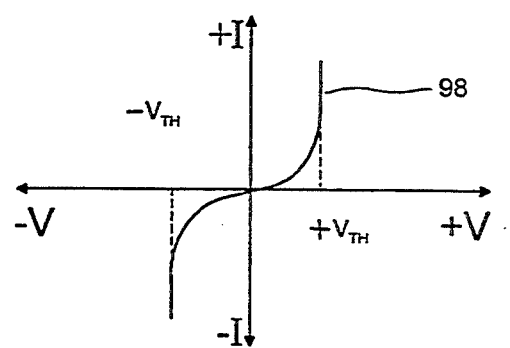
FIG. 7 shows a substantially symmetrical non-linear forward and reverse voltage/current characteristic of any of the mixer elements of FIG. 6.

As previously stated, the mixing element is a two-terminal device having substantially symmetrical non-linear forward and reverse voltage/current characteristics. Those characteristics are shown in FIG. 7, where a conductance curve 98 is shown being essentially symmetrical about the zero volt, zero current axes. The curve 98 also shows the characteristic that, as the voltage increases beyond a threshold voltage $+V_{TH}$ or $-V_{TH}$, the current flow changes from being minimal to such that the conductive diode exhibits current with a very low impedance. Thus, while the amount of current flowing will increase somewhat at low voltage below $\pm V_{TH}$, essentially the mixing element having a voltage/current characteristic as shown in FIG. 7 is such that the mixer is conductive in either direction when the signal from the local oscillator that is imposed on the mixing element is above or below the conduction threshold voltages $\pm V_{TH}$.

Figure 6A:
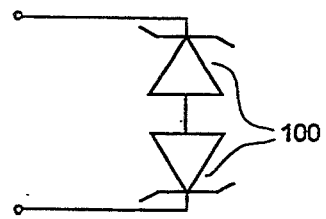
FIG. 6(a) shows a mixing element comprises a pair of zener diodes in antiseries.
Figure 6B:
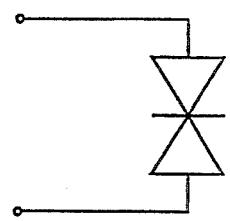
FIG. 6(b) shows a mixing element comprising a planar doped barrier diode.
Figure 6C:
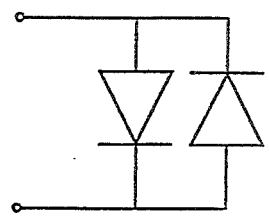
FIG. 6(c) shows a mixing element comprising a pair of antiparallel diodes.

FIG. 6(a) shows a two-terminal device that has a substantially symmetrical non-linear forward and reverse voltage/current characteristic of FIG. 7, and which comprises a pair of zener diodes connected in antiseries—that is, back-to-back. Likewise, a mixer element of FIG. 6(b) may be a planar doped barrier diode, which essentially has a characteristic of two facing diodes. That characteristic is such that, when forward or negative voltage above specific levels is imposed across the planar doped barrier diode, it will be conductive. The two-terminal device of FIG. 6(c) is a pair of antiparallel diodes, and when used in high sensitivity, fast operating radar detectors, they may be such as GaAs diodes.

Also, having regard to the above discussion, it must be noted that with a two-terminal device being used as a mixing element, such as mixing element 82 in FIG. 5, the input signal port, the local oscillator input port, and the intermediate frequency output port, can all connect to the same terminal of the mixing element. In any event, with two terminals, one terminal must be used for at least two of the signal input, local oscillator input, and intermediate frequency output ports, as is well known in the industry.

When incorporated in a radar detector, the mixer of the present invention may particularly be found useful in a radar detector that is intended to detect the presence of radar signals in X-Band, K-Band, or $K_a$-Band. A representative discussion of such an arrangement follows:

The frequency of the local oscillator might, for example, be set at 11.558 GHz. When the incoming radar signal is in the X-Band, it has a frequency of about 10.525 GHz; when in the K-Band, it is about 24.150 GHz; and when in the $K_a$-Band, it may be at about 33.64 GHz. In those circumstances, the bias voltage levels may be chosen as discussed above so that when X-Band input is being tested for, the second DC component of bias voltage is imposed across the mixing element and the maximized resultant frequency is $|10.525$ GHz$\pm 11.558$ GHz$|$, or 1.033 GHz. Likewise, when K-Band input is being tested for, the first zero DC component of bias voltage is imposed across the mixing element, and the maximized resultant frequency is $|24.250$ GHz$\pm 2(11.558)$ GHz$|$, or 1.034 GHz. Similarly, when $K_a$-Band input is being tested for, and the third DC component of bias voltage is imposed across the mixing element, the maximized resultant frequency is $|33.64$ GHz$\pm 3(11.558)$ GHz$|$, or 1.034 GHz.

Another approach that may be taken is to sweep the local oscillator frequency over a narrow band of frequencies that may be from about 0.002 times to about 0.05 times the frequency $f_{IN}$ of the first signal source. Typically, the local oscillator frequency may be swept over about 521 MHz, from about 11.306 GHz to about 11.827 GHz. However, since the resultant frequency may be the input frequency plus or minus one, two, or three times the local oscillator frequency, this results in a maximized resultant frequency that may have a frequency band whose width may be from about 0.002 times the frequency $f_{IN}$ (assuming a mixing product having a one times $f_{LO}$ component), and up to about 0.15 times the frequency $f_{IN}$ (assuming a mixing product having a $3f_{LO}$ component).

Finally, returning to a discussion of FIGS. 3 and 4, it should be evident that it may also be possible to adjust the amplitude of the local oscillator signal having waveform 28 so that it will have appearance relative to the conduction threshold voltages 38 and 40 as shown in either of FIG. 3(b) or FIG. 4(b), with a lesser or greater amplitude of local oscillator voltage, respectively. Indeed, the relative value of the DC voltage $V_2$ and $V_3$ may also differ, as discussed above, or with appropriate control over the amplitude of the local oscillator voltage 28, DC voltages $V_2$ and $V_3$ may remain essentially at the same level.

There has been described above a mixer that may be set for maximized resultant frequency signal by adjusting the value DC component bias voltage across a mixing element having a substantially symmetrical non-linear forward and reverse voltage/current characteristic, and having substantially symmetrical conduction thresholds above and below zero volts. Such a mixer may be utilized in three-Band radar detectors, or otherwise, without departing from the spirit and scope of the accompanying claims.

Other modifications and alterations may be used in the design and manufacture of the mechanical security apparatus of the present invention without departing from the spirit and scope of the accompanying claims.

What is claimed is:

1. A mixer circuit for converting input signals from a first signal source at a frequency of $f_{IN}$, where said mixer circuit comprises a mixing element, together with a local oscillator having fundamental frequency $f_{LO}$, means for conducting input signals to an input signal port of said mixing element, means for conducting a signal from said local oscillator to a local oscillator signal port of said mixing element, and means for conducting a maximized resultant frequency signal away from an output port of said mixing element;

wherein said mixer circuit further comprises a DC bias source for imposing a DC component of bias voltage across said mixing element, where said DC component of bias voltage has a level that can be adjusted;

wherein the magnitude of said resultant frequency signal may be maximized by selection of a DC bias so as to minimize conversion loss in said mixing element at any one of the resultant frequencies selected from the group of frequencies consisting of $|f_{IN} \pm f_{LO}|$, $|f_{IN} \pm 2f_{LO}|$ and $|f_{IN} \pm 3f_{LO}|$;

wherein said mixing element is a two-terminal device having a substantially symmetrical non-linear forward and reverse voltage/current characteristic;

wherein said DC bias source further comprises means to adjust the level of the DC component of bias voltage across said mixing element to a first zero DC component of bias voltage across said mixing element, a second DC component of bias voltage across said mixing element, and a third DC component of bias voltage across said mixing element, and wherein the level of said second DC component of bias voltage across said mixing element is higher than the level of said third DC component of bias voltage across said mixing element;

wherein said mixing element has a pair of conduction threshold voltages which are substantially symmetrical above and below zero volts, beyond which said mixing element will be conductive at least when a signal from said local oscillator is imposed on said mixing element;

wherein the signal from said local oscillator has a substantially sinusoidal voltage waveform with a peak-to-peak voltage which is greater than the voltage difference between said pair of conduction threshold voltages;

wherein, when said first zero DC component of bias voltage is imposed across said mixing element, the voltage across said mixing element is centred about zero volts and passes through each of said conduction threshold voltages in a respective symmetrical positive-going and negative-going sense;

wherein, when said second DC component of bias voltage is imposed across said mixing element, the voltage across said mixing element is shifted by the amount of said second DC component of bias voltage with respect to zero volts in the same sense as said bias voltage is directed so as to be above or below zero volts for a first substantial portion of each cycle thereof, and below or above zero volts for only a second small portion of each cycle, wherein the magnitude of the value of voltage across said mixing element during said first portion exceeds said threshold voltage in the same sense as said voltage shift for about 40% to 60% of the period of said cycle so that said mixing element is conductive in its respective direction during said 40% to 60% of the period of said cycle, and wherein the magnitude of the value of voltage across said mixing element during said second small portion is less than said threshold voltage in the opposite sense as said voltage shift so that said mixing element is not conductive at any time during said second smaller portion; and wherein, when said third DC component of bias voltage is imposed across said mixing element, the voltage across said mixing element is shifted by the amount of said third DC component of bias voltage with respect to zero volts in the same sense as said bias voltage is directed so as to be above or below zero volts for a first portion of each cycle thereof, and below or above zero volts for a second portion of each cycle, wherein the magnitude of the value of voltage across said mixing element during said first portion exceeds said threshold voltage in the same sense as said voltage shift for about 35% to 55% of the period of said cycle so that said mixing element is conductive in its respective direction during said 35% to 55% of said cycle, and wherein the magnitude of the value of voltage across said mixing element during said second portion exceeds said threshold voltage in the opposite sense as said voltage shift so that said mixing element is conductive in the opposite direction for a third period of time during said second portion;

whereby, said mixing element has an idealized reflection coefficient waveform having a fundamental frequency which is twice the fundamental frequency of said local oscillator when said first zero DC component of bias voltage is imposed across said mixing element, so as to give said maximized resultant frequency $|f_{IN} \pm 2f_{LO}|$; and said idealized reflection coefficient waveform has a fundamental frequency which is equal to said fundamental frequency of said local oscillator when said second DC component of bias voltage is imposed across said mixing element, so as to give said maximized resultant frequency $|f_{IN} \pm f_{LO}|$; and said idealized reflection coefficient waveform has a large amplitude component that is at a frequency that is three times the fundamental frequency of said local oscillator when said third DC component of bias voltage is imposed across said mixing element, so as to give said maximized resultant frequency $|f_{IN} \pm 3f_{LO}|$.

2. The mixer circuit of claim 1, wherein said two-terminal device having a substantially symmetrical nonlinear forward and reverse voltage/current characteristic is a planar doped barrier diode.

3. The mixer circuit of claim 1, wherein said two-terminal device having a substantially symmetrical nonlinear forward and reverse voltage/current characteristic is a pair of zener diodes connected in antiseries.

4. The mixer circuit of claim 1, when incorporated in a radar detector having electronic circuitry to process said maximized resultant frequency signal and to generate an alarm signal when said processed maximized resultant frequency signal meets predetermined criteria as determined by said electronic circuitry;

wherein, at any time, said first signal source may have a frequency $f_{IN}$ that is found in the X-Band, K-Band, or $K_a$-Band;

wherein, when said electronic circuitry is adjusted to generate an alarm signal when said first signal source is in the X-Band, said second DC component of bias voltage is imposed across said mixing element;

wherein, when said electronic circuitry is adjusted to generate an alarm signal when said first signal source is in the K-Band, said first zero DC component of bias voltage is imposed across said mixing element; and wherein, when said electronic circuitry is adjusted to generate an alarm signal when said first signal source in the $K_a$-band, said third DC component of bias voltage is imposed across said mixing element.

5. This mixer circuit of claim 1, wherein the signal from said local oscillator may be increased and decreased as to its amplitude, whereby said signal from said local oscillator may be set at a first amplitude and at a second amplitude which is higher than said first amplitude;

and wherein, when said signal from said local oscillator is set at its first amplitude, and said second DC component of bias voltage is imposed across said mixing element, the magnitude of the voltage across said mixing element during said first portion of each cycle thereof exceeds said threshold voltage in the same sense as said voltage shift for about 40% to about 60% of the period of said cycle and said mixing element is conductive during said 40% to about 60% of said period of said cycle, and the magnitude of the value of voltage across said mixing element during said second small portion of each cycle is less than said threshold voltage in the opposite sense as said voltage shift and said mixing element is not conductive; and wherein, when said signal from said local oscillator is set at its second amplitude, and said third DC component of bias voltage is imposed across said mixing element, the magnitude of the value of voltage across said mixing element during a first portion of each cycle of said local oscillator voltage exceeds said threshold voltage in the same sense as said voltage shift for about 35% to about 55% of the period of said cycle and said mixing element is conductive during said 35% to about 55% of said period of said cycle, and the magnitude of the value of voltage across the mixing element during the second portion of each said cycle exceeds said threshold voltage in the opposite sense as said voltage shift so that said mixing element is conductive in the opposite direction for a third period of time during said second portion.

6. The mixer circuit of claim 5, wherein said second DC component of bias voltage and said third DC component of bias voltage are essentially equal to each other.

7. A mixer circuit for converting input signals from a first signal source at a frequency of $f_{IN}$, where said mixer circuit comprises a mixing element, together with a local oscillator having a fundamental frequency $f_{LO}$, means for conducting input signals to an input signal port of said mixing element, means for conducting a signal from said local oscillator to a local oscillator signal port of said mixing element, and means for conducting a maximized resultant frequency signal away from an output port of said mixing element;

wherein said mixer circuit further comprises a DC bias source for imposing a DC component of bias voltage across said mixing element where said DC component of bias voltage has a level that can be adjusted; and wherein the magnitude of said resultant frequency signal may be maximized by selection of a DC bias so as to minimize conversion loss in said mixing element at any one of the resultant frequencies selected from the group of frequencies consisting of $|f_{IN} \pm f_{LO}|$, $|f_{IN} \pm 2f_{LO}|$ and $|f_{IN} \pm 3f_{LO}|$;

wherein said mixing element is a pair of antiparallel diodes:

wherein said DC bias source further comprises means to adjust the level of the DC component of bias voltage across said mixing element to a first zero DC component of bias voltage across said mixing element, a second DC component of bias voltage across said mixing element, and a third DC component of bias voltage across said mixing element, and wherein the level of said second DC component of bias voltage across said mixing element is higher than the level of said third DC component of bias voltage across said mixing element;

wherein said mixing element has a pair of conduction threshold voltages which are substantially symmetrical above and below zero volts, beyond which one or the other of said pair of antiparallel diodes will be conductive at least when a signal from said local oscillator is imposed on said mixing element;

wherein the signal from said local oscillator has a substantially sinusoidal voltage waveform with a peak-to-peak voltage which is greater than the voltage difference between said pair of conduction threshold voltages;

wherein, when said first zero DC component of bias voltage is imposed across said mixing element, the voltage across said mixing element is centred about zero volts and passes through each of said conduction threshold voltages of each one of said pair of antiparallel diodes in a respective symmetrical positive-going and negative-going sense;

wherein, when said second DC component of bias voltage is imposed across said mixing element, the voltage across said mixing element is shifted by the amount of said second DC component of bias voltage with respect to zero volts in the same sense as said bias voltage is directed so as to be above or below zero volts for a first substantial portion of each cycle thereof, and below or above zero volts for only a second small portion of each cycle, wherein the magnitude of the value of voltage across said mixing element during said first portion exceeds said threshold voltage in the same sense as said voltage shift for about 40% to 60% of the period of said cycle so that the respective one of said pair of antiparallel diodes is conductive in its respective direction during said 40% to 60% of the period of said cycle, and wherein the magnitude of the value of voltage across said mixing element during said second small portion is less than said threshold voltage in the opposite sense as said voltage shift so that the respective other one of said pair of antiparallel diodes is not conductive at any time during said second smaller portion; and wherein, when said third DC component of bias voltage is imposed across said mixing element, the voltage across said mixing element is shifted by the amount of said third DC component of bias voltage with respect to zero volts in the same sense as said bias voltage is directed so as to be above or below zero volts for a first portion of each cycle thereof, and below or above zero volts for a second portion of each cycle, wherein the magnitude of the value of voltage across said mixing element during said first portion exceeds said threshold voltage in the same sense as said voltage shift for about 35% to 55% of the period of said cycle so that the respective one of said pair of antiparallel diodes is conductive in its respective direction during said 35% to 55% of said cycle, and wherein the magnitude of the value of voltage across said mixing element during said second portion exceeds said threshold voltage in the opposite sense as said voltage shift so that the respective other one of said pair of antiparallel diodes is conductive in the opposite direction for a third period of time during said second portion;

whereby, said mixing element has an idealized reflection coefficient waveform having a fundamental frequency which is twice the fundamental frequency of said local oscillator when said first zero DC component of bias voltage is imposed across said mixing element, so as to give said maximized resultant frequency $|f_{IN} \pm 2f_{LO}|$; and said idealized reflection coefficient waveform has a fundamental frequency which is equal to said fundamental frequency of said local oscillator when said second DC component of bias voltage is imposed across said mixing element, so as to give said maximized resultant frequency $|f_{IN} \pm f_{LO}|$; and said idealized reflection coefficient waveform has a large amplitude component that is at a frequency that is three times the fundamental frequency of said local oscillator when said third DC component of bias voltage is imposed across said mixing element, so as to give said maximized resultant frequency $|f_{IN} \pm 3f_{LO}|$.

8. The mixer circuit of claim 7, when incorporated in a radar detector having electronic circuitry to process said maximized resultant frequency signal and to generate an alarm signal when said processed maximized resultant frequency signal meets predetermined criteria as determined by said electronic circuitry;

wherein, at any time, said first signal source may have a frequency $f_{IN}$ that is found in the X-Band, K-Band, or $K_a$-Band;

wherein, when said electronic circuitry is adjusted to generate an alarm signal when said first signal source is in the X-Band, said second DC component of bias voltage is imposed across said mixing element;

wherein, when said electronic circuitry is adjusted to generate an alarm signal when said first signal source is in the K-Band, said first zero DC component of bias voltage is imposed across said mixing element; and wherein, when said electronic circuitry is adjusted to generate an alarm signal when said first signal source in the $K_a$-band, said third DC component of bias voltage is imposed across said mixing element.

9. The mixer circuit of claim 8, wherein the fundamental frequency $f_{LO}$ of said local oscillator is 11.558 GHz;

and wherein $f_{IN}$ may be in the X-Band at about 10,525 GHz, or in the K-Band at about 24.250 GHz, or in the $K_a$-Band at about 33.64 GHz;

and wherein, when X-Band input is being tested for, said second DC component of bias voltage is imposed across said mixing element; when K-Band input is being tested for, said first zero DC component of bias voltage is imposed across said mixing element; and when $K_a$-Band input is being tested for, said third DC component of bias voltage is imposed across said mixing element;

so that said maximized resultant frequency is imposed across said DC component of bias voltage is imposed across said mixing element is $|10.525 \text{ GHz} \pm 11.558 \text{ GHz}|$, or 1.033 GHz; and said maximized resultant frequency when said first zero DC component of bias voltage is imposed across said mixing element is $|24.150 \text{ GHz} \pm 2(11.558) \text{ GHz}|$, or 1.034 GHz; and said maximized resultant frequency when said third DC component of bias voltage is imposed across said mixing element is $|33.64 \text{ GHz} \pm 3(11.558) \text{ GHz}|$, or 1.034 GHz.

10. The mixer circuit of claim 7, wherein said local oscillator frequency $f_{LO}$ may be swept over a narrow band of from about 0.002 to about 0.05 times the frequency $f_{IN}$ of said first signal source, so that said maximized resultant frequency may be in a frequency band whose width may be from about 0.002 to about 0.15 times said frequency $f_{IN}$ of said first signal source.

11. This mixer circuit of claim 7, wherein the signal from said local oscillator may be increased and decreased as to its amplitude, whereby said signal from said local oscillator may be set at a first amplitude and at a second amplitude which is higher than said first amplitude;

and wherein, when said signal from said local oscillator is set at its first amplitude, and said second DC component of bias voltage is imposed across said mixing element, the magnitude of the voltage across said mixing element during said first portion of each cycle thereof exceeds said threshold voltage in the same sense as said voltage shift for about 40% to about 60% of the period of said cycle and said mixing element is conductive during said 40% to about 60% of said period of said cycle, and the magnitude of the value of voltage across said mixing element during said second small portion of each cycle is less than said threshold voltage in the opposite sense as said voltage shift and said mixing element is conductive; and wherein, when said signal from said local oscillator is set at its second amplitude, and said third DC component of bias voltage is imposed across said mixing element, the magnitude of the value of voltage across said mixing element during a first portion of each cycle of said local oscillator voltage exceeds said threshold voltage in the same sense as said voltage shift for about 35% to about 55% of the period of said cycle and said mixing element is conductive during said 35% to about 55% of said period of said cycle, and the magnitude of the value of voltage across the mixing element during the second portion of each said cycle exceeds said threshold voltage in the opposite sense as said voltage shift so that said mixing element is conductive in the opposite direction for a third period of time during said second portion.

12. The mixer circuit of claim 11, wherein said second DC component of bias voltage and said third DC component of bias voltage are essentially equal to each other.

* * * * *